US005380555A

United States Patent [19]

Mine et al.

[11] Patent Number: 5,380,555

[45] Date of Patent: Jan. 10, 1995

[54] METHODS FOR THE FORMATION OF A SILICON OXIDE FILM

[75] Inventors: Katsutoshi Mine; Takashi Nakamura; Motoshi Sasaki, all of Chiba, Japan

[73] Assignee: Dow Corning Toray Silicone Co., Ltd., Tokyo, Japan

[21] Appl. No.: 187,239

[22] Filed: Jan. 26, 1994

[30] Foreign Application Priority Data

| | | | |
|---|---|---|---|
| Feb. 9, 1993 | [JP] | Japan | 5-044590 |
| Feb. 10, 1993 | [JP] | Japan | 5-045823 |
| Feb. 10, 1993 | [JP] | Japan | 5-045824 |

[51] Int. Cl.[6] .................. B05D 3/02

[52] U.S. Cl. .................. 427/226; 427/228; 427/377; 427/379; 427/387; 427/397.7; 437/235; 437/238

[58] Field of Search .................. 427/226, 228, 377, 379, 427/387, 397.7; 437/235, 238

[56] References Cited

U.S. PATENT DOCUMENTS

| | | | |
|---|---|---|---|
| 5,118,530 | 6/1992 | Hanneman et al. | 427/377 X |
| 5,145,723 | 9/1992 | Ballance et al. | 427/341 X |

FOREIGN PATENT DOCUMENTS

| | | |
|---|---|---|
| 183675 | 5/1991 | Japan . |

*Primary Examiner*—Michael Lusignan

*Attorney, Agent, or Firm*—Roger E. Gobrogge

[57] ABSTRACT

Disclosed is a method for the formation of ceramic silicon oxide films on substrate surfaces wherein said films are thick, free of cracks and pinholes, and insoluble in organic solvents. These films are formed by coating the surface of a substrate with a silicon resin having the general formula $$(HR_2SiO_{\frac{1}{2}})_X(SiO_{4/2})_{1.0}$$

wherein R is selected from the set comprising the hydrogen atom, alkyl groups, and aryl groups, and $0.1 \leqq X \leqq 2.0$, and then heating the coated substrate to convert the coating into a ceramic silicon oxide film.

18 Claims, No Drawings

METHODS FOR THE FORMATION OF A SILICON OXIDE FILM

BACKGROUND OF THE INVENTION

The present invention relates to methods for the formation of silicon oxide films on the surfaces of substrates. More specifically, the present invention relates to methods for the formation of thick ceramic silicon oxide films that are free of cracks and pinholes and that are insoluble in organic solvents.

The formation of protective films on the surface of substrates is a technique in general use. In the particular case of the electric/electronic industries, recent increases in the degree of integration and layer count of semiconductor devices has resulted in a very substantial increase in their complexity and in topographical variations on their surface. In the case of multi-layer circuits, an interlevel dielectric layer may be formed on the surface of semiconductor devices for purposes of planarization and insulation between interconnections. Alternatively, a passivation coating may be laid down on the surface of a semiconductor device in order to planarize the topographical variations on the semiconductor device surface and protect it from mechanical damage, chemical damage, damage due to static, ionic contaminants, nonionic contaminants, radiation damage, and so forth.

Silicon oxide films are typically used for these interlevel dielectric layers and passivation coatings. Chemical-vapor deposition (CVD) and spin-coatings are examples of the methods used to form these silicon oxide films. Spin-coating methods are exemplified by the use of inorganic SOG (spin-on glass) and organic SOG.

However, the silicon oxide films formed from inorganic SOG suffer from cracking at film thicknesses in excess of 0.3 micrometers. This has made it necessary to carry out multiple applications in order to level height differences of 1 micrometer or more. Moreover, a particular problem with this technology is that the film itself has a poor capacity to bring about planarization, thus requiring an etch-back planarization step after film formation.

By contrast, the silicon oxide films formed from organic SOG are capable of forming crack-free films in thicknesses of 1 micrometer and more by a single application. However, as with inorganic SOG, the organic SOG film itself has a poor planarization capability, and this has also necessitated the execution of an etch-back planarization step after film formation. In addition, the silicon oxide films obtained from organic SOG contain large quantities of residual silanol and alkoxy groups and are therefore highly hygroscopic. Moreover, due to the residual alkoxy groups these films suffer from the problem of carbon poisoning (carbon contamination) in the case of oxygen plasma treatment. As a result of these characteristics, these films have a poor electrical reliability when used for the formation of an interlevel dielectric.

The use of hydrogen silsesquioxane to form silicon oxide films has been proposed (Japanese Patent Application Laid Open [Kokai or Unexamined]Number Hei 3-183675 [183,675/1991]) in order to improve upon the above-described problems. Because this resin melts when heated, it exhibits an excellent capacity to planarize topographical variations and, therefore, does not require an etch-back process. Moreover, since organic groups are not present among this resin's structural units, the risk of carbon poisoning during oxygen plasma treatment is avoided.

The silicon oxide film-formation method proposed in Japanese Patent Application Laid Open Number Hei 3-183675 cannot, however, produce silicon oxide films more than 0.8 micrometers (8,000 angstroms) thick. As a result, this method cannot completely planarize the topographical variations encountered on the surfaces of semiconductor devices, i.e., topographical variations on the surface of a semiconductor device in excess of 0.8 micrometers (8,000 angstroms). In addition, when the production of a thick silicon oxide film is attempted by this method, cracks and pinholes are produced, thus reducing the reliability of the semiconductor device.

Finally, it has been difficult to form well-shaped contact holes in the above silicon oxide films using haloalkane plasma etching because of the large difference in etch rates between the aforesaid silicon oxide films and plasma CVD films. The inventors have now discovered that the relative compactness of these silicon oxide films is responsible for this difference.

The inventors achieved the instant invention as the result of extensive research into a method that would be capable of forming an organic solvent-insoluble, pinhole- and crack-free silicon oxide thick film wherein this film would be able to planarize height differences$\geqq$1 micrometer by melting when heated and would not contain the silanol and alkoxy groups that are the cause of moisture absorption and carbon poisoning of the silicon oxide film product.

SUMMARY OF THE INVENTION

The present invention relates to a method for the formation of a silicon oxide film on a substrate. The method comprises first forming a coating on the surface of a substrate. The base component of this coating is a silicon resin with the general formula $(HR_2SiO_{\frac{1}{2}})_X(SiO_{4/2})_{1.0}$ wherein R is selected from the group consisting of the hydrogen atom, alkyl groups, and aryl groups and $0.1 \leqq X \leqq 2.0$. The coating is then converted into a ceramic silicon oxide film by heating the coated substrate.

The present invention also relate:s to a method for the formation of a silicon oxide film on a substrate in which a coating formed from the above silicon resin is converted into a ceramic silicon oxide film by heating the coated substrate in an atmosphere which contains less than 20 volume % oxygen gas.

The present invention also relates to a method for the formation of a compact (fine and dense) silicon oxide film on a substrate in which a coating formed from the above silicon resin is converted into a ceramic silicon oxide film by heating the coated substrate in an atmosphere which contains at least 20 volume % oxygen gas.

DETAILED DESCRIPTION OF THE INVENTION

The present invention is based on the unexpected discovery that silicon oxide films formed from silicon resins with the general formula $(HR_2SiO_{\frac{1}{2}})_X(SiO_{4/2})_{1.0}$ are organic solvent-insoluble and are pinhole- and crack-free. These films also unexpectedly planarize height differences$\geqq$1 micrometer by melting when heated and do not contain silanol, alkoxy or carbon groups which can damage semiconductor devices.

Silicon resin with the general formula

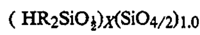

$(HR_2SiO_{1/2})_X(SiO_{4/2})_{1.0}$ is the base component of the initial coating formed on the surface of the substrate by the present invention. The substituent R in the preceding formula is selected from the set comprising the hydrogen atom, alkyl groups, and aryl groups. The alkyl groups encompassed by R are specifically exemplified by methyl, ethyl, propyl, and butyl. The aryl groups encompassed by R are exemplified by phenyl, tolyl, and xylyl. The substituent R is preferably methyl or phenyl. The subscript X in the preceding formula has values of $0.1 \leqq X \leqq 2.0$, preferably $0.2 \leqq X \leqq 2.0$ and more preferably $0.3 \leqq X \leqq 1.0$. When X falls below 0.1, the silicon resin has a pronounced tendency to gel during its synthesis. Moreover, even when synthesis has been achieved without gelation, the resin itself will tend to undergo an increase in molecular weight during storage in solution form. When X exceeds 2.0, the silicon oxide film will have an inadequate hardness for use as a coating. In addition, because the corresponding silicon resin will have a relatively high organic group content when X exceeds 2.0, the resulting film will not have an adequate resistance to etching in subsequent oxygen plasma treatments.

The molecular weight of the subject silicon resin is not specifically restricted. However, its weight-average molecular weight preferably does not exceed 100,000 in order to support planarization of the height differences on semiconductor device substrates through melting and flow of the resin when it is heated. There are also no specific restrictions on physical properties such as viscosity, softening point, etc., but the softening point preferably does not exceed 400° C.

The method for synthesis of the subject silicon resin is not specifically restricted. Methods for its preparation are exemplified by (1) synthesis of the subject silicon resin by dripping a mixture of tetraalkoxysilane and dimethylmonochlorosilane into a solution prepared by the dissolution of alcohol in pure water, and (2) synthesis of the subject silicon resin by dripping tetraalkoxysilane into a solution prepared by dissolving 1,1,3,3-tetramethyldisiloxane in alcohol and hydrochloric acid co-solvents.

The aforesaid silicon resin is the base component of the coating initially formed on the surface of the substrate in the present invention. The other components are not specifically restricted. These other components are specifically exemplified by platinum compounds such as chloroplatinic acid, platinum/alkene complexes, platinum/vinylsiloxane complexes, alcohol solutions of chloroplatinic acid, and so forth; acid catalysts such as hydrochloric acid, acetic acid, and so forth; alcohols such as methanol, ethanol, and so forth; and low-molecular-weight silanol-terminated siloxanes.

No specific restrictions apply to the technique used in the present invention to form the silicon resin-based coating on the surface of the substrate. Techniques operable are specifically exemplified by spin-coating, spraying, or dipping the substrate with/in the liquid silicon resin itself or a solution prepared by dissolving the silicon resin in organic solvent and then removing the solvent as required by the particular technique. In the case of silicon resin that is solid at room temperature, the resin can be softened on the substrate by heating in order to yield the silicon resin-based coating on the surface of the substrate. Organic solvents operable in the former techniques for dissolving the subject silicon resin are not specifically restricted as long as a homogeneous solution of the silicon resin can be obtained. Such organic solvents are specifically exemplified by alcohol solvents such as methanol, ethanol, and so forth; Cellosolve solvents such as methyl Cellosolve, ethyl Cellosolve, and so forth; ketone solvents such as methyl ethyl ketone, methyl isobutyl ketone, and so forth; and ester solvents such as butyl acetate, isoamyl acetate, methyl Cellosolve acetate, ethyl Cellosolve acetate, and so forth. Additional examples of this solvent are silicone solvents, for example, linear siloxanes such as 1,1,1,3,3,3-hexamethyldisiloxane, 1,1,3,3-tetramethyldisiloxane, and so forth; cyclic siloxanes such as 1,1,3,3,5,5,7,7-octamethyltetracyclosiloxane, 1,3,5,7-tetramethyltetracyclosiloxane, and so forth; and silanes such as tetramethylsilane, dimethyldiethylsilane, and so forth. Mixtures of two or more of these organic solvents can also be used.

No specific restrictions apply to the substrates operable in the present invention for formation of the silicon resin-based coating. The substrate is specifically exemplified by glass substrates, ceramic substrates, metal substrates, and semiconductor devices, with semiconductor devices being particularly preferred. The surface of the semiconductor device may present topographical variations, in which event these topographical variations can be planarized by the silicon oxide film-formation method of the present invention.

The substrate carrying the silicon resin-based coating is then heated in order to form a ceramic silicon oxide film. No specific restrictions apply to either the heating temperature or the heating time. However, conditions are preferred that result in the silicon resin-based coating becoming insoluble in solvents (for example, heating to at least 100° C. for at least 30 minutes). Even more preferred are conditions that leave almost no SiH group, silanol group, or alkoxy group in the produced silicon oxide film (for example, heating to at least 300° C. for at least 30 minutes is desirable in this regard).

In an alternative embodiment of the invention, a ceramic silicon oxide film is formed on the substrate carrying the silicon resin-based coating by heating in an atmosphere that contains oxygen at 0 volume % inclusive to 20 volume % exclusive. It has been discovered that good control of the crosslink density in the ceramic silicon oxide film and in particular a thorough relaxation of the internal stresses in the ceramic silicon oxide film product can be obtained by heating the substrate carrying the coating based on the aforesaid silicon resin in an atmosphere that essentially does not contain oxygen or that has an oxygen concentration below 20 volume %. This in turn makes possible the formation of crack-free, pinhole-free ceramic silicon oxide films having thicknesses considerably larger than 1 micrometer. No specific restrictions apply to the gas or gases present in the heating atmosphere in addition to oxygen. However, gases that are inert to the silicon oxide film and the above-described silicon resin coating during the process of forming the ceramic silicon oxide film are preferred. Such gases are specifically exemplified by nitrogen, argon, and helium. While no specific restrictions apply to the temperature and time for heating under the above atmosphere, conditions that result in the silicon resin-based coating becoming insoluble in solvents are preferred (for example, heating to at least 100° C. for at least 30 minutes). Even more preferred are conditions that leave almost no SiH group, silanol group, or alkoxy group in the silicon oxide film (for example, heating to at least 300° C. for at least 30 minutes).

In another alternative embodiment of the invention, a compact (fine and dense) ceramic silicon oxide film is formed on the substrate carrying the silicon resin-based coating by heating in an atmosphere that contains at least 20 volume % oxygen. This process is based on the discoveries (i) that a compact ceramic silicon oxide film can be obtained by heating a substrate carrying the coating based on the aforesaid silicon resin in essentially an oxygen atmosphere or in an atmosphere containing at least 20 volume % oxygen and (ii) that the resulting ceramic silicon oxide film has almost the same etch rate as a plasma CVD film in plasma etching using a mixed gas of 90 volume % tetrafluoromethane and 10 volume % oxygen. No specific restrictions apply to the gas or gases present in the heating atmosphere in addition to oxygen. However, gases that are inert to the silicon oxide film and the above described silicon resin coating during the process of forming the ceramic silicon oxide film are preferred. Such gases are specifically exemplified by nitrogen, argon, and helium. While no specific restrictions apply to the temperature and time for heating the coated substrate, conditions that result in the silicon resin-based coating becoming insoluble in solvents are preferred (for example, heating to at least 100° C. for at least 30 minutes). Even more preferred are conditions that leave almost no SiH group, silanol group, or alkoxy group in the produced silicon oxide film (for example, heating to at least 300° C. for at least 30 minutes).

Formation of the ceramic silicon oxide film can be confirmed in the silicon oxide film-formation method of the present invention by comparing the contents of SiH group (sharp, strong absorption peaks assigned to the SiH group at 910 $cm^{-1}$ and 2150 $cm^{-1}$), alkoxy group (sharp, weak absorption peak assigned to the alkoxy group at 2870 $cm^{-1}$), and silanol group (broad, medium absorption peak assigned to the silanol group in the 3,500 $cm^{-1}$ region) measured in the silicon resin-based coating on the substrate surface using an infrared spectrochemical analyzer with these same parameters measured on the silicon oxide film after heating. Confirmation can also be pursued by immersing the heat-treated silicon oxide film in any of various organic solvents in order to determine if the silicon oxide film has become insoluble in organic solvent.

The silicon oxide film-formation method of the present invention can produce a thick (greater than 1 micrometer), crack-free, and pinhole-free ceramic silicon oxide film. In addition, internal stresses in the ceramic silicon oxide film product can be relaxed by adjusting the content of organic component in the silicon resin. Moreover, because the silicon oxide film-formation method of the present invention can produce a ceramic silicon oxide film at temperatures much lower than the melting point of aluminum, it is useful .for the formation of an interlevel dielectric layers or passivation coatings on semiconductor device surfaces because it avoids the melting-based deterioration of the aluminum that is used for semiconductor device interconnections. The method of the present invention is also useful for the formation of the interlevel dielectric layer in multi-layer semiconductor devices because an organic resin film, silicon oxide film, and so forth, can additionally be formed on the surface of a substrate already carrying a ceramic silicon oxide film formed by the method of the present invention.

The present invention is explained in greater detail through the following reference, working, and comparison examples. Although the silicon resins used to demonstrate the present invention were prepared in accordance with the following reference examples, methods for synthesizing said silicon resin are not limited to the reference examples. The etching conditions used in the examples are as follows:

The substrate carrying the silicon oxide film on its surface was installed in a parallel-electrode reactive-ion-etching device. Plasma etching was conducted for an etching time of 3 minutes using a power per unit area of 0.24 $W/cm^2$, a 13.56 MHz high-frequency power source, a reaction pressure of 3.2 Pa, and a mixed gas of 45 sccm tetrafluoromethane and 5 sccm oxygen. The etch rate of a plasma CVD film when plasma-etched under these conditions was 500 angstroms/minute.

Reference Example 1

40 g methanol and 19.0 g water were weighed into a 200 mL four-neck flask equipped with a spiral condenser, thermometer, and straight tube-equipped addition funnel. The solution temperature was reduced to $\leqq 2°$ C. by ice cooling, and nitrogen was passed through the system at a very low flow rate. While stirring the solution under these conditions, a mixture of 13.2 g (0.14 moles) dimethylchlorosilane and 60.8 g (0.4 moles) methyl orthosilicate was dripped in over 40 minutes from the straight tube-equipped addition funnel. The solution temperature rose to 13° C. during this period due to the evolution of heat, but declined to 8° C. by the time addition was completed. After the completion of addition, the reaction was stirred for an additional 15 minutes while cooling with ice and was then stirred for 4 hours at room temperature. The reaction solution was colorless and transparent. 200 mL methyl isobutyl ketone (MIBK) and then 200 mL water were added to the reaction solution, whereupon phase-separation into two layers occurred. The lower layer was taken off and shaken out with 100 mL MIBK, and after phase-separation the upper layer was collected and combined with the first upper layer. 400 mL water was added to this and the system was shaken. Because this yielded an emulsion, 700 mL diethyl ether was added. Quiescence then resulted in phase-separation (phase-separation required approximately 10 hours). The upper layer was collected and held for 6 hours over magnesium sulfate. The magnesium sulfate was then filtered off and the filtrate was recovered (filtrate A). The solids weight % was measured at 6.35% by weighing filtrate A onto an aluminum plate. 161.07 g filtrate A was weighed into a 125 mL high-density polyethylene wide-mouth bottle and was then concentrated to 30.3 weight % solids using a nitrogen current. At this point neither the odor of diethyl ether nor the odor of methanol could be detected from the concentrate. This concentrate was diluted to 30.0 weight % solids by the addition of the necessary quantity of MIBK to yield a solution designated as solution A. Solution A was directly diluted with tetrahydrofuran to prepare a solution with a solids concentration of 0.2 weight %. This solution was subjected to gel permeation chromatography using tetrahydrofuran as carrier solvent, and the dissolved component was thereby determined to have a number-average molecular weight of 6,260, a weight-average molecular weight of 9,890, and a dispersity of 1.58. The dissolved component was determined by $^{29}$Si nuclear magnetic resonance spectroscopic analysis to be silicon resin with the following structural formula: $[H(CH_3)_2SiO_{1/2}]_{0.35}[SiO_{4/2}]_{1.0}$.

Solution A was dripped onto a silicon wafer and the solvent was evaporated off by standing in air at room temperature to produce a coating of the solids with a thickness of approximately 1 micrometer. This film was subjected to transmission mode-based structural analysis using a Fourier-transform infrared spectrochemical analyzer. A broad, strong absorption peak assigned to the siloxane bond was observed in the region of 1100 $cm^{-1}$, a sharp, strong absorption peak assigned to the Si—$CH_3$ group was observed at 1260 $cm^{-1}$, sharp, strong absorption peaks assigned to the SiH group were observed at 910 $cm^{-1}$ and 2150 $cm^{-1}$, a sharp, weak absorption peak assigned to the alkoxy group was observed at 2870 $cm^{-1}$, a sharp, medium absorption peak assigned to the C—H group was observed at 2960 $cm^{-1}$, and a broad, medium absorption peak assigned to the silanol group was observed in the region of 3500 $cm^{-1}$. When solution A was stored at room temperature for 1 month sealed in a 125 mL wide-mouth bottle made of high-density polyethylene, no visually observable changes, such as a change in viscosity, etc., were found, and the number-average molecular weight at this point was 6,260, the weight-average molecular weight was 9,890, and the dispersity was 1.58.

Reference Example 2

20 g methanol and 9.5 g water were weighed into a 200 mL four-neck flask equipped with a spiral condenser, thermometer, and straight tube-equipped addition funnel. The solution temperature was reduced to≦5° C. by ice cooling, and nitrogen was passed through the system at a very low flow rate. While stirring the solution under these conditions, a mixture of 18.9 g (0.20 moles) dimethylchlorosilane and 30.4 g (0.2 moles) methyl orthosilicate was dripped in over 40 minutes from the straight tube-equipped addition funnel. The solution temperature rose to 13° C. during this period due to the evolution of heat, but declined to 8° C. by the time addition was completed. After the completion of addition, the reaction was stirred for an additional 15 minutes while cooling with ice and was then stirred for 4 hours at room temperature. The reaction solution was colorless and transparent. 100 mL MIBK and then 100 mL water were added to the reaction solution, whereupon phase-separation into two layers occurred. The lower layer was taken off and shaken out with 50 mL MIBK, and after phase-separation the upper layer was collected and combined with the first upper layer. 200 mL water was added to this and the system was shaken, and phase-separation occurred rapidly upon quiescence. An additional water wash was carried out using 200 mL water; the upper layer was then collected and held for 10 hours over magnesium sulfate; and the magnesium sulfate was filtered off. An aliquot of the filtrate was collected and the solvent was completely removed with a nitrogen stream. The product was a colorless, transparent, and highly viscous material. This product was soluble in acetone and carbon tetrachloride. When this product was allowed to stand for several days in air, it converted to a white solid in terms of appearance, but its solubility remained unchanged. The solids yield in the filtrate at this point was calculated at 25.6 g (100% of the theoretical yield). The remaining filtrate was concentrated to a solids concentration in excess of 30% using a nitrogen stream.

A solution with a solids concentration of 30% (solution B) was then prepared by the addition of the necessary quantity of MIBK. Solution B was directly diluted with tetrahydrofuran to prepare a solution with a solids concentration of 0.2 weight %. This solution was subjected to gel permeation chromatography using tetrahydrofuran as carrier solvent, and the dissolved component was thereby determined to have a number-average molecular weight of 4,190, a weight-average molecular weight of 8,510, and a dispersity of 2.03. The dissolved component was determined by $^{29}Si$ nuclear magnetic resonance spectroscopic analysis to be silicon resin with the following structural formula $$[H(CH_3)_2SiO_{1/2}]_{1.0}[SiO_{4/2}]_{1.0}.$$

Solution B was dripped onto a silicon wafer and the solvent was evaporated off by standing in air at room temperature to produce a coating of the solids with a thickness of approximately 1 micrometer. This film was subjected to transmission mode-based structural analysis using a Fourier-transform infrared spectrochemical analyzer. A broad, strong absorption peak assigned to the siloxane bond was observed in the region of 1100 $cm^{-1}$, a sharp, strong absorption peak assigned to the Si—$CH_3$ group was observed at 1260 $cm^{-1}$, sharp, strong absorption peaks assigned to the SiH group were observed at 910 $cm^{-1}$ and 2150 $cm^{-1}$, a sharp, weak absorption peak assigned to the alkoxy group was observed at 2870 $cm^{-1}$, a sharp, medium absorption peak assigned to the C—H group was observed at 2960 $cm^{-1}$, and a broad, medium absorption peak assigned to the silanol group was observed in the region of 3500 $cm^{-1}$.

Reference Example 3

20 g methanol, 12.1 g 7.4N hydrochloric acid (0.07 moles hydrogen chloride) , and 4.69 g (0.035 moles) 1,1,3,3-tetramethyldisiloxane were weighed into a 200 mL four-neck flask equipped with a spiral condenser, thermometer, and straight tube-equipped addition funnel. The solution temperature was reduced to≦5° C. by ice cooling, and nitrogen was passed through the system at a very low flow rate. While stirring the solution under these conditions, 30.4 g (0.2 moles) methyl orthosilicate was dripped in over 40 minutes from the straight tube-equipped addition funnel. The solution temperature rose to 13° C. during this period due to the evolution of heat, but declined to 8° C. by the time addition was completed. After the completion of addition, the reaction was stirred for an additional 15 minutes while cooling with ice and was then stirred for 4 hours at room temperature. The reaction solution was colorless and transparent. 100 mL MIBK and then 100 mL water were added to the reaction solution, whereupon phase-separation into two layers occurred. The lower layer was taken off and shaken out with 50 mL MIBK, and after phase-separation the upper layer was collected and combined with the first upper layer. 200 mL water was added to this and the system was shaken. Because this yielded an emulsion, 200 mL diethyl ether was added. Quiescence then resulted in phase-separation. This phase separation required approximately 10 hours: the upper layer was transparent while the lower layer was an emulsion in which a small quantity of a sticky polymer-like material was suspended. The lower layer was removed, another 200 mL water was added, the system was shaken, and rapid phase-separation occurred upon standing. The upper layer was collected and held for 2.5 days over magnesium sulfate. The magnesium sulfate was then filtered off; an aliquot of the filtrate was collected; and the solvent was completely removed using a nitrogen stream to yield a white solid. This solid was not soluble in acetone. The yield of solids in the filtrate at this point was calculated at 11.49 g (68.8% of the theoretical yield). The remaining filtrate was concentrated using a nitrogen stream to a solids concentration just above 30%, and the solids concentration was then brought to 30% by the addition of the necessary quantity of MIBK to yield solution C. Solution C was directly diluted with tetrahydrofuran to prepare a solution with a solids concentration of 0.2 weight %. This solution was subjected to gel permeation chromatography using tetrahydrofuran as carrier solvent, and the dissolved component was thereby determined to have a number-average molecular weight of 3,620, a weight-average molecular weight of 7,050, and a dispersity of 1.95. The dissolved component was determined by $^{29}Si$ nuclear magnetic resonance spectroscopic analysis to be silicon resin with the following structural formula $[H(CH_3)_2SiO_{\frac{1}{2}}]_{0.35}[SiO_{4/2}]_{1.0}$.

Solution C was dripped onto a silicon wafer and the solvent was evaporated off by standing in air at room temperature to produce a coating of the solids with a thickness of approximately 1 micrometer. This film was subjected to transmission mode-based structural analysis using a Fourier-transform infrared spectrochemical analyzer. A broad, strong absorption peak assigned to the siloxane bond was observed in the region of 1100 $cm^{-1}$, a sharp, strong absorption peak assigned to the Si—Me group was observed at 1260 $cm^{-1}$, sharp, strong absorption peaks assigned to the SiH group were observed at 910 $cm^{-1}$ and 2150 $cm^{-1}$, a sharp, weak absorption peak assigned to the alkoxy group was observed at 2870 $cm^{-1}$, a sharp, medium absorption peak assigned to the C—H group was observed at 2960 $cm^{-1}$, and a broad, medium absorption peak assigned to the silanol group was observed in the region of 3500 $cm^{-1}$.

EXAMPLE 1

The solution A prepared in Reference Example 1 was spin-coated on a substrate for semiconductor: device fabrication (height variation=1.0 micrometers) to give a silicon resin coating having a maximum thickness of 1.42 micrometers. After this coating formation step, the semiconductor device substrate was placed in a cylindrical circular oven, heated in air for 1 hour at 400° C., and slowly cooled to room temperature in air. Evaluation of the properties of the ceramic silicon oxide film formed on the semiconductor device substrate confirmed that the maximum thickness was 1.22 micrometers and that the topographical variations of a semiconductor device surface had been planarized to uniformity. The results of microscopic observation confirmed that there were no pinholes or cracks in the silicon oxide film. Transmission mode-based structural analysis of the silicon oxide film using a Fourier-transform infrared spectrochemical analyzer determined that the SiH peaks (910 $cm^{-1}$ and 2150 $cm^{-1}$), silanol peak (region of 3500 $cm^{-1}$), and alkoxy group peak (2870 $cm^{-1}$) were in each case completely extinguished. The produced silicon oxide film was insoluble in organic solvents such as MIBK, acetone, etc.

EXAMPLE 2

Silicon resin with the formula $[H(CH_3)_2SiO_{\frac{1}{2}}]_{0.5}[SiO_{4/2}]_{1.0}$ was prepared by the procedure of Reference Example 1 and dissolved in MIBK to give the 30 weight % solution. This solution was spin-coated on a substrate for semiconductor device fabrication (height variation=1.0 micrometers) to give a silicon resin coating having a maximum thickness of 1.54 micrometers. After this coating formation step, the semiconductor device substrate was placed in a cylindrical circular oven, heated in air for 1 hour at 400° C., and slowly cooled to room temperature in air. Evaluation of the properties of the ceramic silicon oxide film formed on the semiconductor device substrate confirmed that the maximum thickness was 1.38 micrometers and that the topographical variations of a semiconductor device surface had been planarized to uniformity. The results of microscopic observation confirmed that there were no pinholes or cracks ill the silicon oxide film. Transmission mode-based structural analysis of the silicon oxide film using a Fourier-transform infrared spectrochemical analyzer determined that the SiH peaks (910 $cm^{-1}$ and 2150 $cm^{-1}$), silanol peak (region of 3500 $cm^{-1}$), and alkoxy group peak (2870 $cm^{-1}$) were in each case completely extinguished. The produced silicon oxide film was insoluble in organic solvents such as MIBK, acetone, etc.

EXAMPLE 3

The solution B prepared in Reference Example 2 was spin-coated on a substrate for semiconductor device fabrication (height variation=1.0 micrometers) to give a silicon resin coating having a maximum thickness of 2.43 micrometers. After this coating formation step, the semiconductor device substrate was placed in a cylindrical circular oven, heated in air for 1 hour at 400° C., and slowly cooled to room temperature in air. Evaluation of the properties of the ceramic silicon oxide film formed on the semiconductor device substrate confirmed that the maximum thickness was 1.98 micrometers and that the topographical variations of a semiconductor device surface had been planarized to uniformity. The results of microscopic observation confirmed that there were no pinholes or cracks in the silicon oxide film. Transmission mode-based structural analysis of the silicon oxide film using a Fourier-transform infrared spectrochemical analyzer determined that the SiH peaks (910 $cm^{-1}$ and 2150 $cm^{-1}$), silanol peak (region of 3500 $cm^{-1}$), and alkoxy group peak (2870 $cm^{-1}$) were in each case completely extinguished. The produced silicon oxide film was insoluble in organic solvents such as MIBK, acetone, etc.

EXAMPLE 4

The solution C prepared in Reference Example 3 was spin-coated on a substrate for semiconductor device fabrication (height variation=1.0 micrometers) to give a silicon resin coating having a maximum thickness of 1.72 micrometers. After this coating formation step, the semiconductor device substrate was placed in a cylindrical circular oven, heated in air for 1 hour at 300° C., then heated in air for 1 hour at 400° C., and finally slowly cooled to room temperature in air. Evaluation of the properties of the ceramic silicon oxide film formed on the semiconductor device substrate confirmed that the maximum thickness was 1.47 micrometers and that the topographical variations of a semiconductor device surface had been planarized to uniformity. The results of microscopic observation confirmed that there were no pinholes or cracks in the silicon oxide film. Transmission mode-based structural analysis of the silicon oxide film using a Fourier-transform infrared spectrochemical analyzer determined that the SiH peaks (910 $cm^{-1}$ and 2150 $cm^{-1}$), silanol peak (region of 3500 $cm^{-1}$), and alkoxy group peak (2870 $cm^{-1}$ ) were in each case completely extinguished. The produced silicon oxide film was insoluble in organic solvents such as MTBK, acetone. etc.

EXAMPLE 5

The solution A prepared in Reference Example 1 was spin-coated on a substrate for semiconductor device fabrication (height variation=1.0 micrometers) to give a silicon resin coating having a maximum thickness of 1.60 micrometers. After this coating formation step, the semiconductor device substrate was placed in a cylindrical circular oven, heated in a nitrogen atmosphere for 1 hour at 400° C., and then slowly cooled to room temperature in a nitrogen atmosphere. Evaluation of the properties of the ceramic silicon oxide film formed on the semiconductor device substrate confirmed that the maximum thickness was 1.39 micrometers and that the topographical variations of a semiconductor device surface had been planarized to uniformity. The results of microscopic observation confirmed that there were no pinholes or cracks in the silicon oxide film. Transmission mode-based structural analysis of the silicon oxide film using a Fourier-transform infrared spectrochemical analyzer determined that the SiH peaks (910 $cm^{-1}$ and 2150 $cm^{-1}$), silanol peak (region of 3500 $cm^{-1}$, and alkoxy group peak (2870 $cm^{-1}$) were in each case completely extinguished. The produced silicon oxide film was insoluble in organic solvents such as MIBK, acetone, etc.

EXAMPLE 6

The solution A prepared in Reference Example 1 was spin-coated on a substrate for semiconductor device fabrication (height variation=1.0 micrometers) to give a silicon resin coating having a maximum thickness of 1.52 micrometers. After this coating formation step, the semiconductor device substrate was placed in a cylindrical circular oven, heated for 1 hour at 400° C. in a mixed atmosphere of 10 volume % oxygen and 90 volume % nitrogen, and then slowly cooled to room temperature in the same mixed atmosphere. Evaluation of the properties of the ceramic silicon oxide film formed on the semiconductor device substrate confirmed that the maximum thickness was 1.32 micrometers and that the topographical variations of a semiconductor device surface had been planarized to uniformity. The results of microscopic observation confirmed that there were no pinholes or cracks in the silicon oxide film. Transmission mode-based structural analysis of the silicon oxide film using a Fourier-transform infrared spectrochemical analyzer determined that the SiH peaks (910 $cm^{-1}$ and 2150 $cm^{-1}$), silanol peak (region of 3500 $cm^{-1}$), and alkoxy group peak (2870 $cm^{-1}$ ) were in each case completely extinguished. The produced silicon oxide film was insoluble in organic solvents such as MIBK, acetone, etc.

EXAMPLE 7

Silicon resin with the following structural formula $[H(CH_3)_2SiO_{\frac{1}{2}}]_{1.0}[SiO_{4/2}]_{1.0}$ was prepared by the same procedure as in Reference Example 1, and its 30 weight % solution in MIBK was spin-coated on a substrate for semiconductor device fabrication (height variation=1.0 micrometers) to give a silicon resin coating having a maximum thickness of 2.40 micrometers. After this coating formation step, the semiconductor device substrate was placed in a cylindrical circular oven, heated in a nitrogen atmosphere for 1 hour at 400° C., and then slowly cooled to room temperature in a nitrogen atmosphere. Evaluation of the properties of the ceramic silicon oxide film formed on the semiconductor device substrate confirmed that the maximum thickness was 1.96 micrometers and that the topographical variations of a semiconductor device surface had been planarized to uniformity. The results of microscopic observation confirmed that there were no pinholes or cracks in the silicon oxide film. Transmission mode-based structural analysis of the silicon oxide film using a Fourier-transform infrared spectrochemical analyzer determined that the SiH peaks (910 $cm^{-1}$ and 21 $cm^{-1}$), silanol peak (region of 3500 $cm^{-1}$), and alkoxy group peak (2870 $cm^{-1}$) were in each case completely extinguished. The produced silicon oxide film was insoluble in organic solvents such as MIBK, acetone, etc.

EXAMPLE 8

The solution A prepared in Reference Example 1 was spin-coated on a substrate for semiconductor device fabrication (height variation=1.0 micrometers) to give a silicon resin coating having a maximum thickness of 1.32 micrometers. After this coating formation step, the semiconductor device substrate was placed in a cylindrical circular oven, heated in an oxygen atmosphere for 1 hour at 400° C., and then slowly cooled to room temperature in an oxygen atmosphere. Evaluation of the properties of the silicon oxide film formed on the semiconductor device substrate confirmed that the maximum thickness was 1.10 micrometers and that the topographical variations of a semiconductor device surface had been planarized to uniformity. The results of microscopic observation confirmed that there were no pinholes or cracks in the silicon oxide film. Transmission mode-based structural analysis of the silicon oxide film using a Fourier-transform infrared spectrochemical analyzer determined that the SiH peaks (910 $cm^{-1}$ and 2150 $cm^{-1}$), silanol peak (region of 3500 $cm^{-1}$), and alkoxy group peak (2870 $cm^{-1}$ ) were in each case completely extinguished. The produced silicon oxide film was insoluble in organic solvents such as MIBK, acetone, etc. This silicon oxide film was also subjected to plasma etching under the conditions given above: its etch rate was 650 angstroms/minute, or 1.3-times that of the plasma CVD film under the same conditions.

EXAMPLE 9

The solution A prepared in Reference Example 1 was spin-coated on a substrate for semiconductor device fabrication (height variation=1.0 micrometers) to give a silicon resin coating having a maximum thickness of 1.35 micrometers. After this coating formation step, the semiconductor device substrate was placed in a cylindrical circular oven, heated for 1 hour at 400° C. in air, and then slowly cooled to room temperature in air. Evaluation of the properties of the silicon oxide film formed on the semiconductor device substrate confirmed that the maximum thickness was 1.15 micrometers and that the topographical variations of a semiconductor device surface had been planarized to uniformity. The results of microscopic observation confirmed that there were no pinholes or cracks in the silicon oxide film. Transmission mode-based structural analysis of the silicon oxide film using a Fourier-transform infrared spectrochemical analyzer determined that the SiH peaks (910 $cm^{-1}$ and 2150 $cm^{-1}$), silanol peak (region of 3500 $cm^{-1}$), and alkoxy group peak (2870 $cm^{-1}$) were in each case completely extinguished. The produced silicon oxide film was insoluble in organic solvents such as MIBK, acetone, etc. This silicon oxide film was also subjected to plasma etching under the conditions given above: its etch rate was 730 angstroms/minute, or 1.46-times that of the plasma CVD film under the same conditions.

EXAMPLE 10

Silicon resin with the following structural formula $[H(CH_3)_2SiO_{\frac{1}{2}}]SiO_{4/2}]_{1.0}$ was prepared by the same procedure as in Reference Example 1, and its 30 weight % solution in MIBK was spin-coated on a substrate for semiconductor device fabrication (height variation=1.0 micrometers) to give a silicon resin coating having a maximum thickness of 1.35 micrometers. After this coating formation step, the semiconductor device substrate was placed in a cylindrical circular oven, heated in an oxygen atmosphere for 1 hour at 400° C., and then slowly cooled to room temperature in an oxygen atmosphere. Evaluation of the properties of the silicon oxide film formed on the semiconductor device substrate confirmed that the maximum thickness was 1.11 micrometers and that the topographical variations of a semiconductor device surface had been planarized to uniformity. The results of microscopic observation confirmed that there were no pinholes or cracks in the silicon oxide film. Transmission mode-based structural analysis of the silicon oxide film using a Fourier-transform infrared spectrochemical analyzer determined that the SiH peaks (910 $cm^{-1}$ and 2150 $cm^{-1}$), silanol peak (region of 3500 $cm^{-1}$), and alkoxy group peak (2870 $cm^{-1}$) were in each case completely extinguished. The produced silicon oxide film was insoluble in organic solvents such as MIBK, acetone, etc. This silicon oxide film was also subjected to plasma etching under the conditions given above: its etch rate was 700 angstroms/minute, or 1.4-times that of the plasma CVD film under the same conditions.

Comparison Example 1

An inorganic SOG (tradename: OCD-typeII, from Tokyo Oka Kogyo Kabushiki Kaisha) was spin-coated on a substrate for semiconductor device fabrication (height variation=1.0 micrometers) to give a resin coating having a maximum thickness of 0.55 micrometers. After this coating formation step, the semiconductor device substrate was placed in a cylindrical circular oven, heated in air for 1 hour at 400° C., and slowly cooled to room temperature in air. When the attempt was made to evaluate the properties of the silicon oxide film formed on the semiconductor device substrate, it was found that a large number of visually observable cracks had been produced, and measurement of the film thickness was therefore not possible.

Comparison Example 2

Hydrogen silsesquioxane was dissolved in MIBK to prepare the 30 weight % solution. This solution was spin-coated on a substrate for semiconductor device fabrication (height variation=1.0 micrometers) to give a silicon resin coating having a maximum thickness of 1.15 micrometers. After this coating formation step, the semiconductor device substrate was placed in a cylindrical circular oven, heated in air for 1 hour at 400° C., and slowly cooled to room temperature in air. The maximum thickness of the silicon oxide film formed on the semiconductor device substrate was 0.98 micrometers; however, microscopic observation confirmed the presence of a large number of microcracks in the silicon oxide film.

Comparison Example 3

The solution A prepared in Reference Example 1 was spin-coated on a substrate for semiconductor device fabrication (height variation=1.0 micrometers) to give a silicon resin coating having a maximum thickness of 1.30 micrometers. After this coating formation step, the semiconductor device substrate was placed in a cylindrical circular oven, heated for 1 hour at 400 in an oxygen atmosphere, and then slowly cooled to room temperature in an oxygen atmosphere. While the silicon oxide film formed on the semiconductor device substrate had a maximum thickness of 1.10 micrometers, microscopic observation revealed that a large number of microcracks had been produced in the silicon oxide film.

Comparison Example 4

An organic SOG (tradename: OCD-type 7, from Tokyo Oka Kogyo Kabushiki Kaisha) was spin-coated on a substrate for semiconductor device fabrication (height variation=1.0 micrometers) to give a silicon resin coating having a maximum thickness of 0.72 micrometers. After this coating formation step, the semiconductor device substrate was placed in a cylindrical circular oven, heated in air for 1 hour at 400° C., and slowly cooled to room temperature in air. Evaluation of the properties of the silicon oxide film formed on the semiconductor device substrate confirmed that the maximum thickness was 0.56 micrometers. The results of microscopic observation confirmed that there were no pinholes or cracks in the silicon oxide film. Transmission mode-based structural analysis of the silicon oxide film using a Fourier-transform infrared spectrochemical analyzer confirmed the presence of both the silanol peak (region of 3500 $cm^{-1}$) and the alkoxy group peak (2870 $cm^{-1}$). The produced silicon oxide film was insoluble in organic solvents such as MIBK, acetone, etc. This silicon oxide film was also subjected to plasma etching under the conditions given above: its etch rate was 1,240 angstroms/minute, or 2.48-times that of the plasma CVD film under the same conditions.

Comparison Example 5

The solution A prepared in Reference Example 1 was spin-coated on a substrate for semiconductor device fabrication (height variation=1.0 micrometers) to give a silicon resin coating having a maximum thickness of 1.35 micrometers. After this coating formation step, the semiconductor device substrate was placed in a cylindrical circular oven, heated in a nitrogen atmosphere for 1 hour at 400° C., and then slowly cooled to room temperature in a nitrogen atmosphere. Evaluation of the properties of the silicon oxide film formed on the semiconductor device substrate confirmed that the maximum thickness was 1.19 micrometers and that the topographical variations of a semiconductor device surface had been planarized to uniformity. The results of microscopic observation confirmed that there were no pinholes or cracks in the silicon oxide film. This silicon oxide film was also subjected to plasma etching under the conditions given above: its etch rate was 1,040 angstroms/minute, or 2.08-times that of the plasma CVD film under the same conditions.

That which is claimed is:

1. A method for the formation of a silicon oxide film on a substrate comprising:

forming a coating on the surface of a substrate, wherein the base component of the coating is a silicon resin with the general formula $$(HR_2SiO_{1/2})_X(SiO_{4/2})_{1.0}$$

and wherein R is selected from the group consisting of the hydrogen atom, alkyl groups, and aryl groups and $0.1 \leqq X \leqq 2.0$; and converting the coating into a ceramic silicon oxide film by heating the coated substrate.

2. The method of claim 1 wherein $0.3 \leqq X \leqq 1.0$.

3. The method of claim 1 wherein the silicon resin has a weight-average molecular weight which does not exceed 100,000 and a softening point which does not exceed 400° C.

4. The method of claim 1 wherein the coating also contains materials selected from the group consisting of platinum compounds, acid catalysts, alcohols, and low-molecular-weight silanol-terminated siloxanes.

5. The method of claim 1 wherein the substrate is selected from the group consisting of glass substrates, ceramic substrates, metal substrates, and semiconductor devices.

6. The method of claim 1 wherein the coated substrate is heated to at least 300° C. for at least 30 minutes.

7. A method for the formation of a silicon oxide film on a substrate comprising:

forming a coating on the surface of a substrate, wherein the base component of the coating is a silicon resin with the general formula $$(HR_2SiO_{1/2})_X(SiO_{4/2})_{1.0}$$

and wherein R is selected from the group consisting of the hydrogen atom, alkyl groups, and aryl groups and $0.1 \leqq X \leqq 2.0$; and converting the coating into a ceramic silicon oxide film by heating the coated substrate ill an atmosphere that contains less than 20 volume % oxygen gas.

8. The method of claim 7 wherein $0.2 \leqq X \leqq 1.0$.

9. The method of claim 7 wherein the silicon resin has a weight-average molecular weight which does not exceed 100,000 and a softening point which does not exceed 400° C.

10. The method of claim 7 wherein the coating also contains materials selected from the group consisting of platinum compounds, acid catalysts, alcohols, and low-molecular-weight silanol-terminated siloxanes.

11. The method of claim 7 wherein the substrate is selected from the group consisting of glass substrates, ceramic substrates, metal substrates, and semiconductor devices.

12. The method of claim 7 wherein the coated substrate is heated to at least 300° C. for at least 30 minutes.

13. A method for the formation of a silicon oxide film on a substrate comprising:

forming a coating on the surface of a substrate, wherein the base component of the coating is a silicon resin with the general formula $$(HR_2SiO_{1/2})_X(SiO_{4/2})_{1.0}$$

and wherein R is selected from the group consisting of the hydrogen atom, alkyl groups, and aryl groups and $0.1 \leqq X \leqq 2.0$; and converting the coating into a ceramic silicon oxide film by heating the coated substrate in an atmosphere that contains at least 20 volume % oxygen gas.

14. The method of claim 13 wherein $0.2 \leqq X \leqq 1.0$.

15. The method of claim 13 wherein the silicon resin has a weight-average molecular weight which does not exceed 100,000 and a softening point which does not exceed 400° C.

16. The method of claim 13 wherein the coating also contains materials selected from the group consisting of platinum compounds, acid catalysts, alcohols, and low-molecular-weight silanol-terminated siloxanes.

17. The method of claim 13 wherein the substrate is selected from the group consisting of glass substrates, ceramic substrates, metal substrates, and semiconductor devices.

18. The method of claim 13 wherein the coated substrate is heated to at least 300° C. for at least 30 minutes.

* * * * *